(12) United States Patent
Natsumeda et al.

(10) Patent No.: US 11,825,630 B2
(45) Date of Patent: Nov. 21, 2023

(54) COOLING SYSTEM

(71) Applicant: NEC Corporation, Tokyo (JP)

(72) Inventors: Takafumi Natsumeda, Tokyo (JP);
Minoru Yoshikawa, Tokyo (JP);
Masaki Chiba, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 17/624,910

(22) PCT Filed: Jul. 9, 2019

(86) PCT No.: PCT/JP2019/027100
§ 371 (c)(1),
(2) Date: Jan. 5, 2022

(87) PCT Pub. No.: WO2021/005701
PCT Pub. Date: Jan. 14, 2021

(65) Prior Publication Data
US 2022/0279682 A1  Sep. 1, 2022

(51) Int. Cl.
*H05K 7/20* (2006.01)
(52) U.S. Cl.
CPC ..... *H05K 7/20327* (2013.01); *H05K 7/20309* (2013.01); *H05K 7/20318* (2013.01); *H05K 7/20827* (2013.01)
(58) Field of Classification Search
CPC ...... F25B 2700/1933; F25B 2700/1931; F25B 2600/0253; F25B 2600/2501; F25B 2500/07
See application file for complete search history.

(56) References Cited

U.S. PATENT DOCUMENTS

| 6,112,532 A | 9/2000 | Bakken |
| 2010/0211228 A1* | 8/2010 | Chao ..................... F25B 49/027 700/282 |
| 2016/0014934 A1 | 1/2016 | Shiraiwa et al. |
| 2016/0047392 A1 | 2/2016 | Bernocchi et al. |

(Continued)

FOREIGN PATENT DOCUMENTS

| JP | H05-203195 A | 8/1993 |
| JP | H08-200861 A | 8/1996 |

(Continued)

OTHER PUBLICATIONS

International Search Report for PCT Application No. PCT/JP2019/027100, dated Aug. 27, 2019.

(Continued)

*Primary Examiner* — Ana M Vazquez
(74) *Attorney, Agent, or Firm* — Sughrue Mion, PLLC

(57) ABSTRACT

A cooling system includes: a local cooler that is positioned near a heat source and evaporates a liquid-phase refrigerant by receiving heat from the heat source; a turbo compressor that compresses a gas-phase refrigerant that absorbed the heat in the local cooler; an outdoor unit that condenses the gas-phase refrigerant supplied from the turbo compressor by heat dissipation; and an expansion valve that depressurizes the refrigerant supplied from the outdoor unit and sends the refrigerant to the local cooler. The refrigerant is a low-pressure refrigerant having a condensing pressure lower than a predetermined value.

5 Claims, 2 Drawing Sheets

(56) References Cited

U.S. PATENT DOCUMENTS

2018/0252233 A1\* 9/2018 Suemitsu ............... F04D 29/62
2018/0320932 A1 11/2018 Cooper
2018/0371958 A1 12/2018 Fukushima et al.

FOREIGN PATENT DOCUMENTS

| | | |
|---|---|---|
| JP | 2001-507784 A | 6/2001 |
| JP | 2009-193246 A | 8/2009 |
| JP | 2010-072993 A | 4/2010 |
| JP | 2015-021633 A | 2/2015 |
| JP | 2016-514789 A | 5/2016 |
| JP | 2018-091588 A | 6/2018 |
| JP | 2018-115773 A | 7/2018 |
| WO | 2013/108636 A1 | 7/2013 |
| WO | 2014/126005 A1 | 8/2014 |
| WO | 2017/142072 A1 | 8/2017 |

OTHER PUBLICATIONS

JP Office Action for JP Application No. JP2021-527872, dated Jul. 27, 2021 with English Translation.
Extended European Search Report for EP Application No. EP19937218.6 dated Jun. 1, 2022.
JP Office Action for JP Application No. 2021-135165, dated Mar. 14, 2023 with English Translation.

\* cited by examiner

COOLING SYSTEM

This application is a National Stage Entry of PCT/JP2019/027100 filed on Jul. 9, 2019, the contents of all of which are incorporated herein by reference, in their entirety.

TECHNICAL FIELD

The present invention relates to a cooling system for efficiently exhausting heat from an electronic device that serves as a heat source.

BACKGROUND ART

In a data center where a large number of electronic devices are densely arranged, much heat is expected to be generated, and so a heat exchange system is provided that exhausts heat generated by the electronic devices by adopting a cooling system that achieves heat transfer due to the phase changes of evaporation and condensation of a refrigerant even if a large amount of heat is generated during high-load operation of the electronic devices.

As this heat exchange system, for example, the cooling system shown in Patent Document 1, and the indirect refrigerant air conditioner shown in Patent Document 2 are known.

The cooling system shown in Patent Document 1 includes an equipment room in which a plurality of electronic devices are arranged, an evaporator provided near these electronic devices to cool the electronic devices by vaporizing a refrigerant, a cooling tower that cools and condenses the vaporized refrigerant by means of the outside air, a compressor for compressing the vaporized refrigerant, and a circulation line connected so that the refrigerant circulates between the evaporator, the compressor and the cooling tower.

In the indirect refrigerant air conditioner shown in Patent Document 2, a constitution is disclosed in which a refrigeration cycle heat exchanger on the heat source side and a thermosiphon heat exchanger on the user side are coupled by a removable heat exchanger, and the refrigerant used in the thermosiphon is a refrigerant having a lower pressure and a lower risk than the refrigerant used in the refrigeration cycle.

PRIOR ART DOCUMENTS

Patent Documents

Patent Document 1: Japanese Unexamined Patent Application, First Publication No. 2009-193246
Patent Document 2 Japanese Unexamined Patent Application, First Publication No. H5-203195

SUMMARY OF THE INVENTION

Problem to be Solved by the Invention

Patent Documents 1 and 2 describe a constitution relating to a heat exchange system that exhausts heat by utilizing the phase change cycle of evaporation/condensation of a refrigerant.

However, the heat exchange systems shown in Patent Documents 1 and 2 have a problem that the efficiency of the evaporation/condensation phase-change cycle of the refrigerant is poor as a whole, and so the proposal of a new technique for comprehensively solving the problem has been expected.

The present invention has been made in view of the above circumstances, and provides a cooling system capable of comprehensively improving the efficiency of the evaporation/condensation phase-change cycle of a refrigerant.

Means for Solving the Problem

In order to solve the above problem, the present invention proposes the following means.

A cooling system of the present invention includes a local cooler that is positioned near a heat source and that evaporates a liquid-phase refrigerant by receiving heat from the heat source, a turbo compressor that compresses a gas-phase refrigerant produced in the local cooler, an outdoor unit that condenses the gas-phase refrigerant supplied from the turbo compressor by heat dissipation, and an expansion valve that depressurizes the refrigerant supplied from the outdoor unit and sends the refrigerant to the local cooler, the refrigerant being a low-pressure refrigerant having a condensing pressure lower than a prescribed value.

Effect of the Invention

The cooling system of the present invention enables efficient operation in evaporation, condensation and handling of a refrigerant.

EXAMPLE EMBODIMENT

Figure 1:
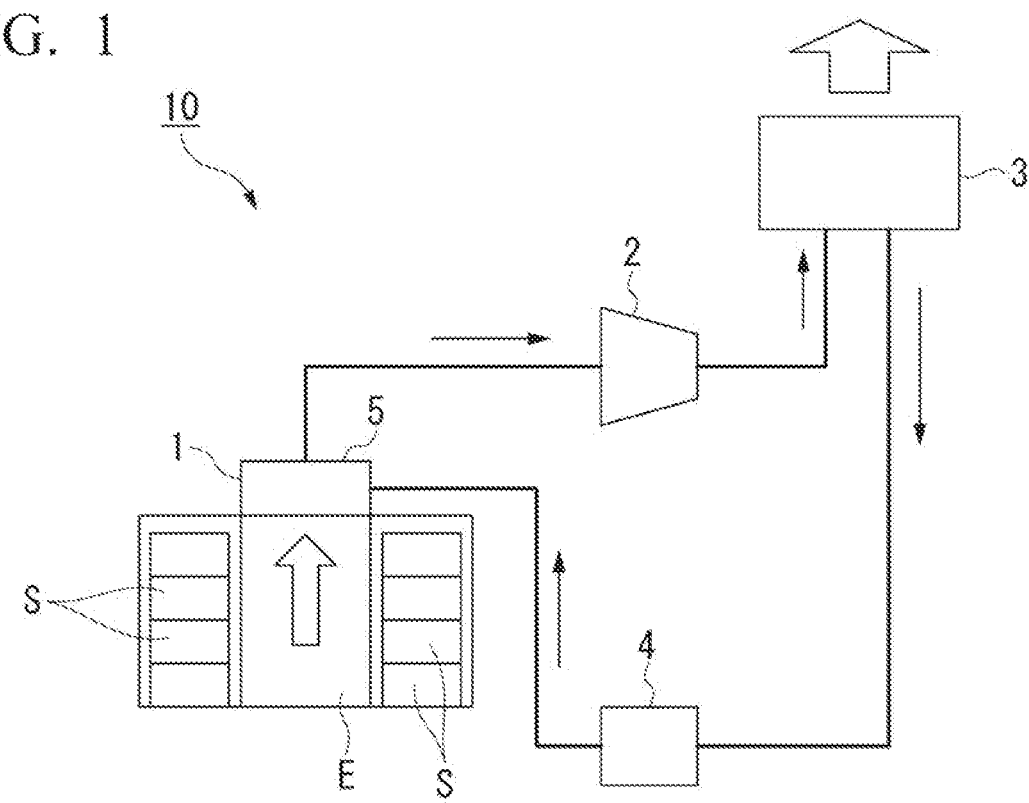
FIG. 1 is a schematic configuration diagram of a cooling system according to the present invention.

A cooling system 10 according to the present invention will be described with reference to FIG. 1.

The cooling system 10 mainly includes a local cooler 1, a turbo compressor 2, an outdoor unit 3, and an expansion valve 4.

The local cooler 1 has a heat exchange unit 5 that is positioned near servers S that serves as heat sources in a server room (upper position of an exhaust area E positioned between the servers S in the figure) to directly receive heat from the server S. The heat exchange unit 5 of the local cooler 1 exhausts heat from the servers S by evaporating an internal liquid-phase refrigerant with the heat of the servers S.

The turbo compressor 2 is for compressing the gas-phase refrigerant produced in the local cooler 1 and forcibly sending the refrigerant to the outdoor unit 3. For example, a centrifugal compressor in which a plurality of impellers are arranged around a rotating shaft is used.

The outdoor unit 3 is for condensing the gas-phase refrigerant by performing heat dissipation to an external space on the gas-phase refrigerant supplied from the turbo compressor 2.

The expansion valve 4 is for depressurizing the refrigerant supplied from the outdoor unit 3 to obtain a complete liquid-phase refrigerant, and afterward sending the refrigerant to the local cooler 1.

As the refrigerant used in the cooling system 10, a low-pressure refrigerant having a condensing pressure lower than a predetermined value is used.

Specifically, it is possible to use a low-pressure refrigerant with lower condensing pressure than conventional air conditioning refrigerants subject to the High Pressure Gas Safety Act, that is, a low-pressure refrigerant with a high cycle rate not subject to the High Pressure Gas Safety Act, easy to deliver in parts, and not requiring a person qualified in relation to high-pressure gas. Therefore, there is an advantage that it is not necessary to go through troublesome procedures such as equipment inspection each time even if additional work is required, such as when adding the cooling system 10 with the addition of a server as a heat source.

In addition, when a low-pressure refrigerant is used, since the flow rate per calorific value increases, it is possible to favorably use a turbo compressor, which is superior to a positive displacement compressor in the amount of refrigerant transported per volume (total amount of calorific value to be transported).

As described in detail above, the cooling system 10 according to the present invention uses a low-pressure refrigerant with low condensing pressure as the refrigerant, and uses the turbo compressor 2 as a compressor that compresses the refrigerant evaporated by the local cooler 1, whereby highly efficient refrigerant compression is possible, and as a result it becomes possible to efficiently exhaust heat from the electronic device in the server S that serves as the heat source.

By using as the refrigerant a low-pressure refrigerant that is not subject to the High Pressure Gas Safety Act, is easy to deliver in parts, and does not require a person qualified in relation to high-pressure gas in the cooling system 10 of the present invention, efficient refrigerant handling is possible, and operational efficiency can be improved in this respect as well.

In the cooling system 10 of the present invention, since the local cooler 1 positioned near the heat source can directly receive the heat from the electronic device in the server S serving as the heat source to evaporate the liquid-phase refrigerant, efficient heat transfer from the heat source and refrigerant evaporation are possible.

That is, the cooling system 10 of the present invention enables efficient operation in all of the evaporation, condensation, and handling of the refrigerant.

First Example Embodiment

Figure 2:
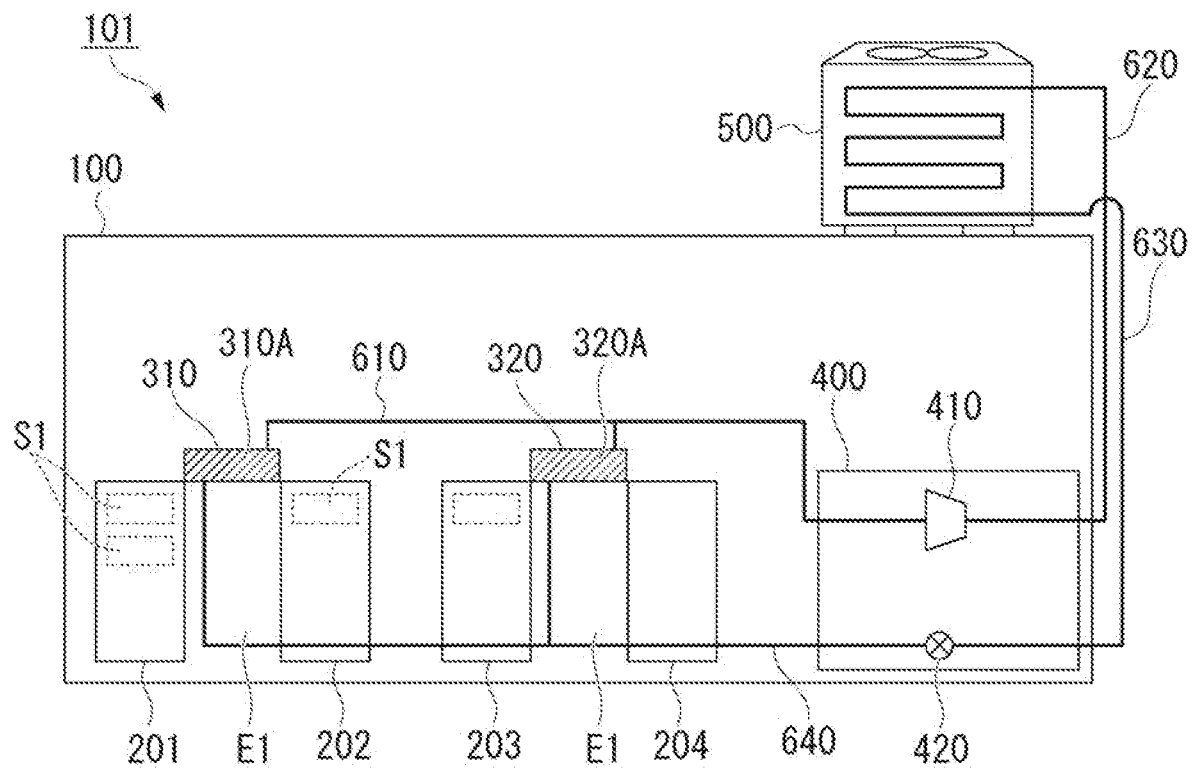
FIG. 2 is a schematic configuration diagram of a cooling system according to a first example embodiment of the present invention.

A system diagram of the cooling system 101 according to the first example embodiment of the present invention will be described with reference to FIG. 2.

The cooling system 101 according to the first example embodiment mainly includes local coolers 310 and 320, a turbo compressor 410, an outdoor unit 500, and an expansion valve 420.

In these components, the local coolers 310 and 320, the turbo compressor 410 and the outdoor unit 500 are connected by vapor pipes 610 and 620, while the outdoor unit 500, the expansion valve 420 and the local coolers 310 and 320 are connected by liquid pipes 630 and 640.

In the cooling system 101, components other than the outdoor unit 500 are arranged in the server room 100.

Further, in the cooling system 101, the turbo compressor 410 and the expansion valve 420 in the server room 100 are installed in an indoor unit 400.

The local coolers 310 and 320 are arranged near servers S1, which are heat sources in the server room, and include heat exchange units 310A and 320A which directly receive the heat from the servers S1.

A plurality of the servers S1 are housed in server racks 201 to 204 arranged at regular intervals, and the heat is discharged toward an exhaust area E1 located between the server racks 201 and 204.

The heat exchange units 310A and 320A of the local coolers 310 and 320 are located above the exhaust area E1 between the server racks 201 and 204, and by evaporating the internal liquid-phase refrigerant with the heat of the servers S1, exhaust the heat from the exhaust area E1.

The turbo compressor 410 is for compressing the gas-phase refrigerant generated in the local coolers 310 and 320 and forcibly sending the gas-phase refrigerant to the outdoor unit 500.

Specifically, a centrifugal compressor in which a plurality of impellers are arranged around a rotating shaft is used as the turbo compressor 410, and by compressing and pressurizing the gas-phase refrigerant taken in from the suction nozzle with the centrifugal force when passing through high-speed rotating impellers, the gas-phase refrigerant is discharged from the exhaust nozzle.

The outdoor unit 500 is for condensing the gas-phase refrigerant by dissipating heat of the gas-phase refrigerant supplied from the turbo compressor 410 to the external space.

The expansion valve 420 is for depressurizing the refrigerant supplied from the outdoor unit 500 to obtain a complete liquid-phase refrigerant and then sending the liquid-phase refrigerant to the local coolers 310 and 320.

Then, in the cooling system 101 configured as described above, the refrigerant evaporates in the heat exchange units 310A and 320A of the local coolers 310 and 320 individually installed above the exhaust areas E1 of the server racks 201 to 204, whereby the heat contained in the exhaust of the servers S1 can be absorbed.

As a result, by converting the exhaust gas of the server racks 201 to 204 into cold air with the local coolers 310 and 320, the entire server room 100 can be efficiently cooled before the heat diffuses throughout the entire room.

The refrigerant evaporated in the local coolers 310 and 320 is subsequently sent to the turbo compressor 410 through the vapor pipe 610. The refrigerant that is raised to a high temperature and high pressure by the turbo compressor 410 is condensed by dissipating the heat to the outside air in the outdoor unit 500, and passes through the liquid pipe 630 to move to the expansion valve 420. The refrigerant depressurized in the expansion valve 420 becomes liquid-phase refrigerant to be supplied again to the local coolers 310 and 320.

As the refrigerant used in the cooling system 101, a low-pressure refrigerant having a condensing pressure lower than a predetermined value is used.

Specifically, the refrigerant used in the cooling system 101 is a low-pressure refrigerant having a lower condensing pressure than a conventional air-conditioning refrigerant subject to the High Pressure Gas Safety Act (a low-pressure refrigerant with an operating pressure of $\frac{1}{5}$ to $\frac{1}{10}$ of a conventional refrigerant). That is, a low-pressure fluorocarbon having a high cycle rate that is not subject to the High Pressure Gas Safety Act, is easy to deliver in parts, and does not require a person qualified in relation to high-pressure gas.

It is preferable that the pressure of the refrigerant be a pressure equal to or lower than the pressure that can be used in the flexible pipe for circulating the refrigerant between devices such as server racks in a data center to be cooled in the operating temperature range of the cooling system 101 (so-called withstand pressure), for example, equal to or lower than 0.5 MPaA (absolute pressure). The reason for this is that using a flexible pipe for a pipe between devices improves assemblability and transportability, and generally a flexible pipe has a lower withstand pressure than pipes made of hard materials such as copper pipes and aluminum pipes.

Depending on the scale (calorific value) of the data center to be cooled, it is conceivable to install just the number of units of a turbo compressor with a cooling capacity of 40 kW, a flow rate of 3 m$^3$/min, an inlet pressure of 0.1 MPaA, and an outlet pressure of 0.3 MPaA to attain the required cooling capacity.

Further, in the cooling system 101, since it is necessary to lay the pipes in the immediate vicinity of the server racks 201 to 204, it is necessary to safely perform the laying work even when the servers are in operation. For this reason, in the cooling system 101 of the present example embodiment using the low-pressure refrigerant, since resin pipes that do not need to be welded can be used, in the unlikely event that a pipe is damaged, there is the advantage of less damage to the servers compared to water or a high-pressure refrigerant.

Further, in the present example embodiment, the turbo compressor 410 (centrifugal compressor) is used as the compressor. In this turbo compressor 410, when a low-pressure refrigerant is used, the flow rate per unit calorific value tends to be higher than that of a normal refrigerant, and there is an advantage in that the flow rate per size is higher than that of a positive displacement compressor such as a scroll compressor. Moreover, since the turbo compressor 410, which is a centrifugal compressor, can be made oil-free, there is an advantage in cleanliness when laying pipes in the server room 100.

As described in detail above, according to the cooling system 101 of the first example embodiment, by using a low-pressure refrigerant having a low condensing pressure as the refrigerant, and by using the turbo compressor 410 as a centrifugal compressor that compresses the refrigerant evaporated by the local coolers 310 and 320, highly efficient refrigerant compression becomes possible, and as a result, heat can be efficiently exhausted from the electronic device in the server S1 which is a heat source.

In the cooling system 101 according to the first example embodiment, by using as the refrigerant a low-pressure refrigerant that is not subject to the High Pressure Gas Safety Act, is easy to transport in parts, and does not require personnel qualified in relation to high-pressure gas, efficient handling of refrigerant becomes possible, and operational efficiency can be improved in this respect as well.

In the cooling system 101 according to the first example embodiment, since it is possible to directly receive heat from the electronic device in the server S1 that serves as a heat source with the local coolers 310 and 320 positioned near the heat source and evaporate the liquid-phase refrigerant, it becomes possible to efficiently transfer heat from the heat source and refrigerant evaporation.

That is, in the cooling system 101 according to the first example embodiment, efficient operation is possible in all of the evaporation, condensation, and handling of the refrigerant.

In the cooling system 101, the turbo compressor 410 and the expansion valve 420 are installed in the indoor unit 400 in the server room 100, but may be arranged outside the server room 100 together with the outdoor unit 500.

Although installed above the server racks 201 to 204, the local coolers 310 and 320 may also be installed on the back surface of the server racks 201 to 204 or another position. In short, it is desirable that the local coolers 310 and 320 be arranged to be capable of taking in the heat discharged from server racks 201 to 204 before diffusing into the server room. Further, these server racks 201 to 204 are not limited to the number shown in the drawings.

Depending on the boiling point, pressure, and diversion of the refrigerant, not only a centrifugal turbo compressor but also an axial turbo compressor may be used.

Second Example Embodiment

Figure 3:
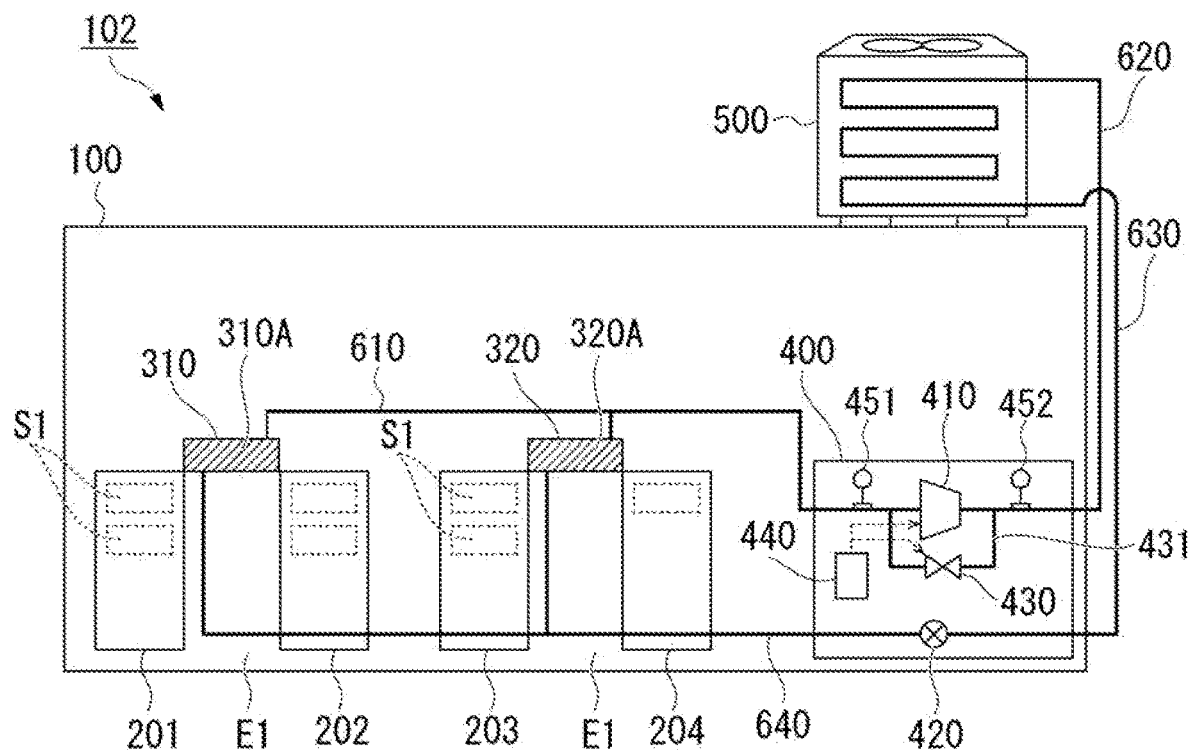
FIG. 3 is a schematic configuration diagram of a cooling system according to a second example embodiment of the present invention.

A system diagram of a cooling system 102 according to a second example embodiment of the present invention will be described with reference to FIG. 3.

The configuration of the cooling system 102 according to the second example embodiment differs from that of the cooling system 101 according to the first example embodiment on the point of changing the rotation speed of the turbo compressor 410 by an inverter 440 to adjust the cooling capacity.

That is, in the cooling system 101 according to the first example embodiment, when it becomes necessary to change the cooling capacity due to, for example, a fluctuation in the load of the servers, or an addition of servers or maintenance, the inverter 440, it is possible to adjust the cooling capacity by changing the rotation speed of the compressor 410.

As a specific configuration, in the turbo compressor 410, a surge phenomenon may occur in which the fluid flow becomes unstable due to an increase in the ratio of the pressures at the inlet and the outlet (hereinbelow referred to as the pressure ratio). If such a surge phenomenon continues, the compressor itself may be damaged.

Therefore, in the second example embodiment, in order to monitor the pressure ratio, which fluctuates due to disturbances such as a fluctuation of the server load, pressure gauges (pressure adjusting means) 451 and 452 for detecting the pressure of the gas-phase refrigerant at the inlet and outlet of the turbo compressor 410, the inverter 440 that controls the rotation speed of the turbo compressor 410, and a hot gas bypass valve 430 that quickly adjusts the pressure fluctuation are provided.

The inverter 440 has a function of controlling the rotation speed of the turbo compressor 410 on the basis of the pressure ratio of the inlet side pressure and the outlet side pressure detected by the pressure gauges 451 and 452, and a function of a valve control unit that promptly avoids the surge phenomenon by opening the hot gas bypass valve 430 when the pressure ratio becomes equal to or higher than a preset standard set value.

The hot gas bypass valve 430 is provided in the middle of a bypass pipe 431 that bypasses the turbo compressor 410 and connects the vapor pipe 610 on the inlet side and the vapor pipe 620 on the outlet side to each other, and operates on the basis of a control signal output from the inverter 440.

As the reference setting value, a numerical range of the pressure ratio (compression ratio) of the pressure gauges 451 and 452, which assumes all the servers S1 in the server racks 201 to 204 are operated, is preset.

Then, when some of a large number of the servers S1 are stopped (for example, for maintenance, server expansion, replacement work, and the like) and the pressure ratio of the pressure gauges 451 and 452 deviates from the reference set pressure, along with controlling the rotation speed of the turbo compressor 410, the operation of opening the hot gas bypass valve 430 is performed in order to avoid the surge phenomenon.

As described in detail above, in the cooling system 102 according to the second example embodiment, the pressure ratio between the inlet side and the outlet side of the turbo compressor 410 can be reduced by rotation control of the turbo compressor 410 and the opening operation of the hot gas bypass valve 430 based on the pressure ratio detected by the pressure gauges 451 and 452.

As a result, in the cooling system 102, the turbo compressor 410 can be protected from the surge phenomenon while appropriately adjusting the overall cooling performance in synchronization with the load of the servers S1.

Depending on the boiling point, pressure, and diversion of the refrigerant, not only a centrifugal turbo compressor but also an axial turbo compressor may be used.

Third Example Embodiment

Figure 4:
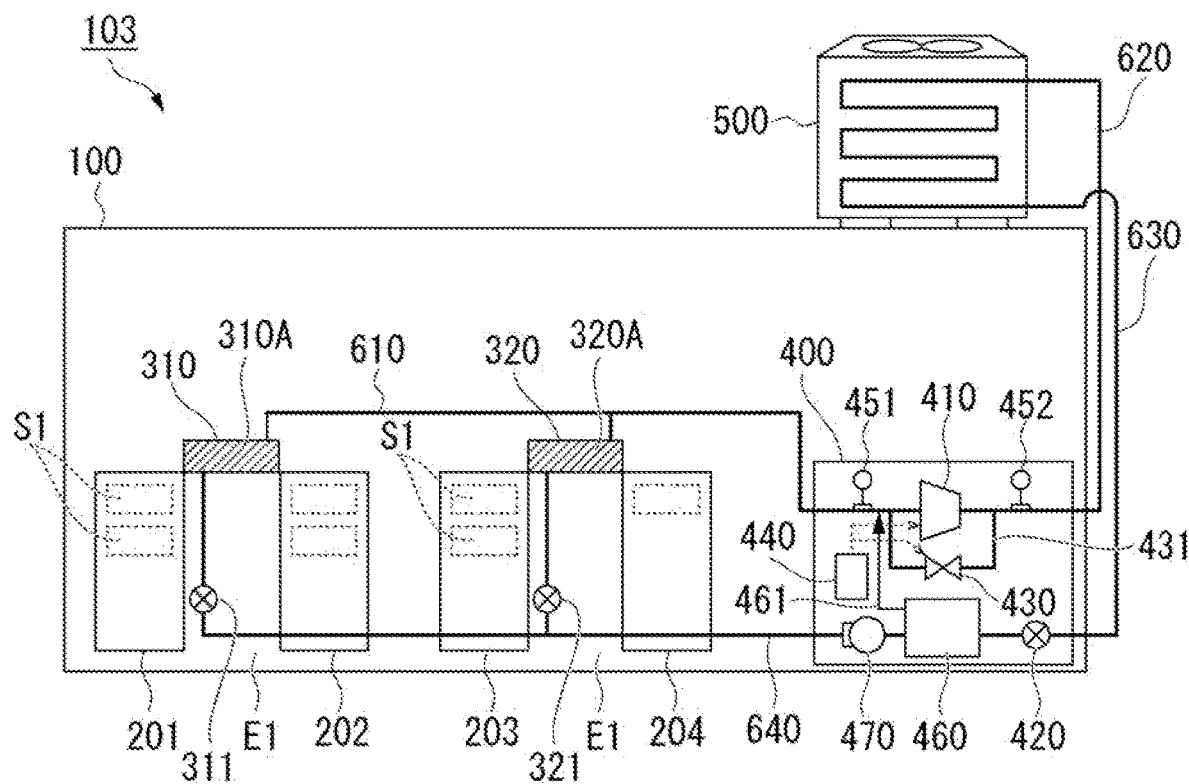
FIG. 4 is a schematic configuration diagram of a cooling system according to a third example embodiment of the present invention.

A system diagram of a cooling system 103 according to the third example embodiment of the present invention will be described with reference to FIG. 4.

The cooling system 103 according to the third example embodiment has a configuration that differs from that of the cooling system 102 according to the second example embodiment in that a refrigerant tank 460 serving as a buffer, a refrigerant pump 470, and flow rate adjusting valves 311 and 321 are sequentially provided on the downstream side of the expansion valve 420.

The refrigerant tank 460 is for performing gas-liquid separation on the refrigerant supplied from the refrigerant pump 470 and temporary storing the refrigerant, and by separating the refrigerant into a gas phase and a liquid phase and supplying only the liquid-phase refrigerant to the refrigerant pump 470, prevents damage to the refrigerant pump 470.

Further, a connecting pipe 461 that returns the gas-phase refrigerant that underwent gas-liquid separation in the refrigerant tank 460 to the vapor pipe 610 located on the upstream side of the turbo compressor 410 are provided at the upper portion of the refrigerant tank 460.

The refrigerant pump 470 is for supplying the liquid-phase refrigerant in the refrigerant tank 460 to the local coolers 310 and 320 that serve as evaporators through the liquid pipe 640.

The flow rate adjusting valves 311 and 321 are provided in the liquid pipe 640 at locations on the upstream side of the local coolers 310 and 320, respectively, and evenly supply the liquid-phase refrigerant to the local coolers 310 and 320 regardless of the installation layout of the server racks 201 to 204 by individually adjusting the flow rate.

Depending on the boiling point, pressure, and diversion of the refrigerant, not only a centrifugal turbo compressor but also an axial turbo compressor may be used.

As described in detail above, in the cooling system 103 according to the third example embodiment, it is possible to evenly supply the liquid-phase refrigerant to the local coolers 310 and 320 and so prevent biased cooling performance regardless of the installation layout of the server racks 201 to 204 by individually adjusting the flow rate adjusting valves 311 and 321 located on the upstream side of the local coolers 310 and 320, respectively.

In the cooling system 103 according to the third example embodiment, by temporarily storing the refrigerant on the upstream side of the refrigerant pump 470, it is possible to prevent the cooling pump 470 from being supplied with refrigerant liquid in which gas and liquid are mixed, and so it is possible to prevent the surging phenomenon in the refrigerant pump 470.

Although the example embodiments of the present invention have been described in detail with reference to the drawings, specific configurations are not limited to these example embodiments, and design changes and the like within a range not deviating from the gist of the present invention are also included.

INDUSTRIAL APPLICABILITY

The present invention can be used in a cooling system that efficiently cools electronic devices while preventing damage to devices such as a compressor and heat exchanger as well as a pipe of a refrigerant circulation system.

DESCRIPTION OF REFERENCE SYMBOLS

1: Local cooler
2: Turbo compressor
3: Outdoor unit
4: Expansion value
5: Heat exchange unit
10: Cooling system
100: Server room
101: Cooling system
102: Cooling system
103: Cooling system
201: Server rack
202: Server rack
203: Server rack
204: Server rack
310: Local cooler
311: Flow rate adjusting valve
320: Local cooler
321: Flow rate adjusting valve
410: Turbo compressor
420: Expansion valve
430: Hot gas bypass valve
431: Bypass pipe
440: Inverter
451: Pressure gauge
452: Pressure gauge
460: Refrigerant tank
470: Refrigerant pump
500: Outdoor unit
610: Vapor pipe
620: Vapor pipe
630: Liquid pipe
640: Liquid pipe
S: Server
S1: Server
E: Exhaust area
E1: Exhaust area

What is claimed is:
1. A cooling system comprising:
a local cooler that is positioned near a heat source and evaporates a liquid-phase refrigerant by receiving heat from the heat source;

a turbo compressor that compresses a gas-phase refrigerant that absorbed the heat in the local cooler;

an outdoor unit that condenses the gas-phase refrigerant supplied from the turbo compressor by heat dissipation;

an expansion valve that depressurizes the refrigerant supplied from the outdoor unit and sends the refrigerant to the local coole;

a pressure gauge that is provided in each of an inlet side pipe and an outlet side pipe of the turbo compressor and detects pressure of the gas-phase refrigerant supplied from the local cooler; and an inverter that controls rotation speed of the turbo compressor based on a pressure ratio of inlet side pressure and outlet side pressure detected by the pressure gauge, and wherein the refrigerant has a condensing pressure equal to or lower than 0.5 MPaA, wherein the local cooler includes a plurality of local coolers that correspond to the heat source, a flow rate adjusting valve that adjusts a supply amount of the liquid-phase refrigerant is respectively provided in a middle of a refrigerant supply pipe that supplies the liquid-phase refrigerant to the local coolers, a refrigerant supply pump that supplies the liquid-phase refrigerant to the local coolers is provided between the flow rate adjusting valve and the expansion valve, and a refrigerant tank that temporarily stores the refrigerant is installed on an inlet side of the refrigerant supply pump, and wherein a bypass pipe is installed, the bypass pipe connecting the inlet side pipe and the outlet side pipe to each other so as to bypass the turbo compressor and including a hot gas bypass valve in a middle thereof, and the inverter controls opening and closing of the hot gas bypass valve together with the rotation speed of the turbo compressor based on the pressure ratio of the inlet side pressure and the outlet side pressure detected by the pressure gauge.

2. The cooling system according to claim 1, wherein the local cooler includes a heat exchange unit that is installed above an exhaust area between server racks and that directly receives the heat from a server that serves as the heat source.

3. The cooling system according to claim 1, wherein the turbo compressor is a centrifugal compressor in which a plurality of impellers are arranged around a rotating shaft.

4. The cooling system according to claim 1, wherein the inverter performs open operation of the hot gas bypass valve when the pressure ratio of the inlet side pressure and the outlet side pressure detected by the pressure gauge exceeds a predetermined reference set value related to a surge phenomenon.

5. The cooling system according to claim 1, wherein a connecting pipe is installed at an upper portion of the refrigerant tank, the connecting pipe guiding a gas-phase component separated from the refrigerant supplied to the refrigerant tank to an upstream side of the compressor.

* * * * *